United States Patent [19]

Sauvan

[11] Patent Number: 4,798,218

[45] Date of Patent: Jan. 17, 1989

[54] CLEANING APPARATUS FOR ELECTRONIC COMPONENTS AND/OR PRECISION PARTS OF MACHINERY

[75] Inventor: Gérard Sauvan, Cagnes sur Mer, France

[73] Assignee: Outillages Scientifiques et de Laboratoires O.S.L., Paris, France

[21] Appl. No.: 867,766

[22] Filed: May 28, 1986

[30] Foreign Application Priority Data

May 28, 1985 [FR] France .................. 85 07979

[51] Int. Cl.⁴ .................. B08B 3/00; B08B 3/12; B08B 7/04
[52] U.S. Cl. .................. 134/74; 134/130; 134/131
[58] Field of Search .................. 134/72, 73, 74, 130, 134/131, 184; 68/3 SS; 361/384; 174/16 R, 176 F; 310/341, 342

[56] References Cited

U.S. PATENT DOCUMENTS

| | | | |
|---|---|---|---|
| 2,746,466 | 5/1956 | Clague et al. | 134/72 |
| 2,943,134 | 6/1960 | Liao et al. | 174/17 GF |
| 3,822,714 | 7/1974 | Doose | 174/176 F |
| 3,868,272 | 2/1975 | Tardoskegyi | 134/131 |
| 3,968,013 | 7/1976 | Boynton | 134/73 |
| 4,102,350 | 7/1978 | Chelton et al. | 134/130 |
| 4,311,157 | 1/1982 | Jubenville et al. | 134/130 |
| 4,319,930 | 3/1982 | Yano et al. | 134/72 |
| 4,521,092 | 6/1985 | Ferrante | 134/184 |

Primary Examiner—Harvey C. Hornsby
Assistant Examiner—Corinne M. Reinckens
Attorney, Agent, or Firm—Marshall & Melhorn

[57] ABSTRACT

Cleaning apparatus particularly for cleaning printed circuit boards, of the type comprising an enclosure through which passes a conveyor conveying the boards along a continuous path, at least one cleaning unit, using solvent and so arranged as to spray the solvent over and under the boards carried along the path, at least one solvent reservoir situated at the lower part of the enclosure and designed to receive the solvent dripping after the spraying operation, wherein the apparatus further comprises an ultrasonic cleaning unit comprising a solvent storing tank arranged in the enclosure, in parallel relationship with respect to a horizontal portion of the path and at a short distance below the horizontal portion and above the reservoir, and equipped with ultrasonic generators, the storing tank having at least one draining pipe issuing into the reservoir and controlled by a valve, and an overflow along one side of the tank on the boards inlet side, and controls for the selective control of the spray-cleaning unit, of said ultrasonic cleaning unit and of said valve, so as to determine a first mode of operation in spray cleaning and second mode of operation in ultrasonic cleaning.

7 Claims, 3 Drawing Sheets

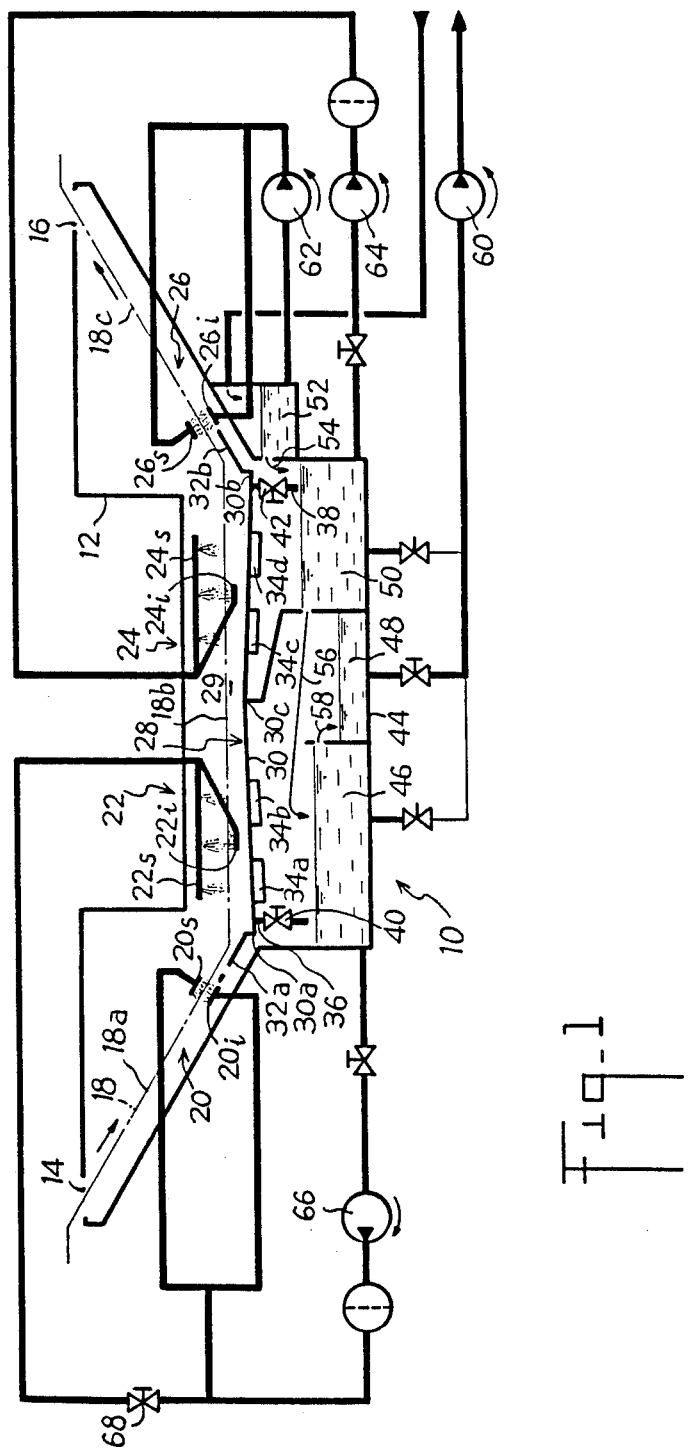

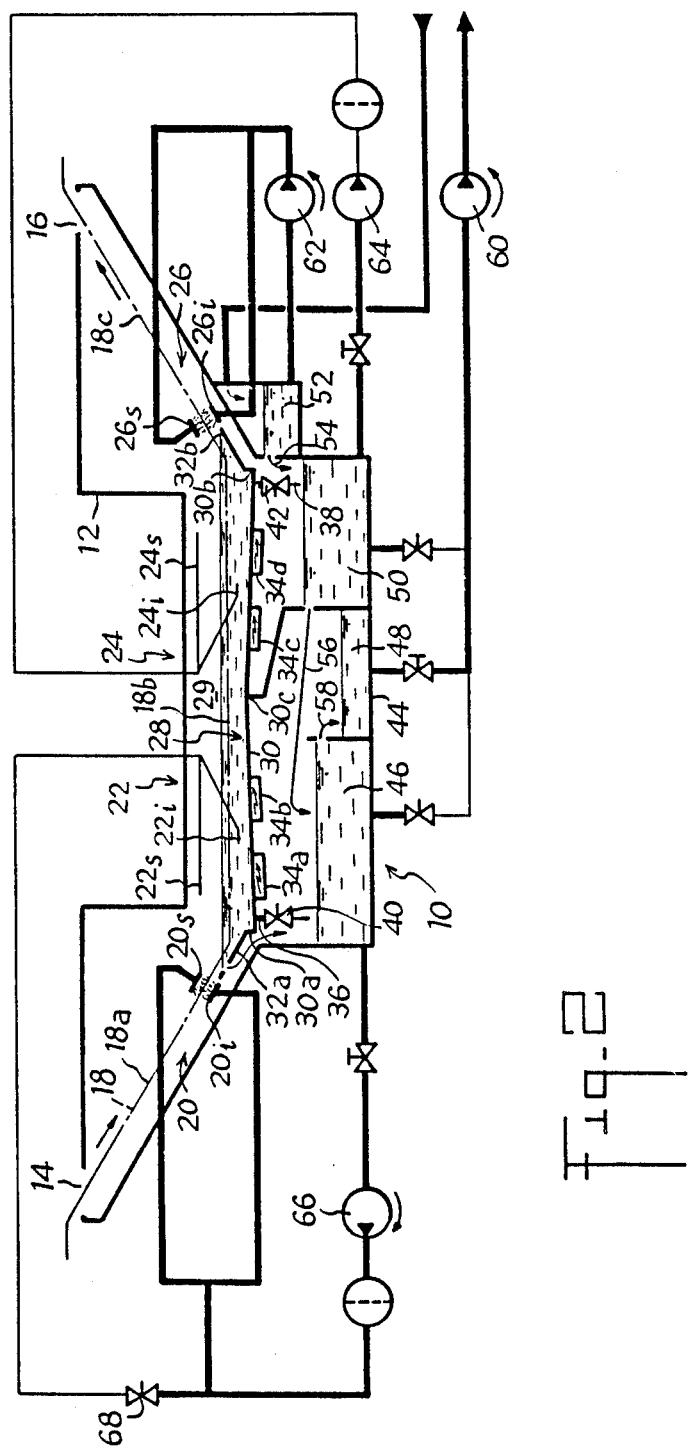

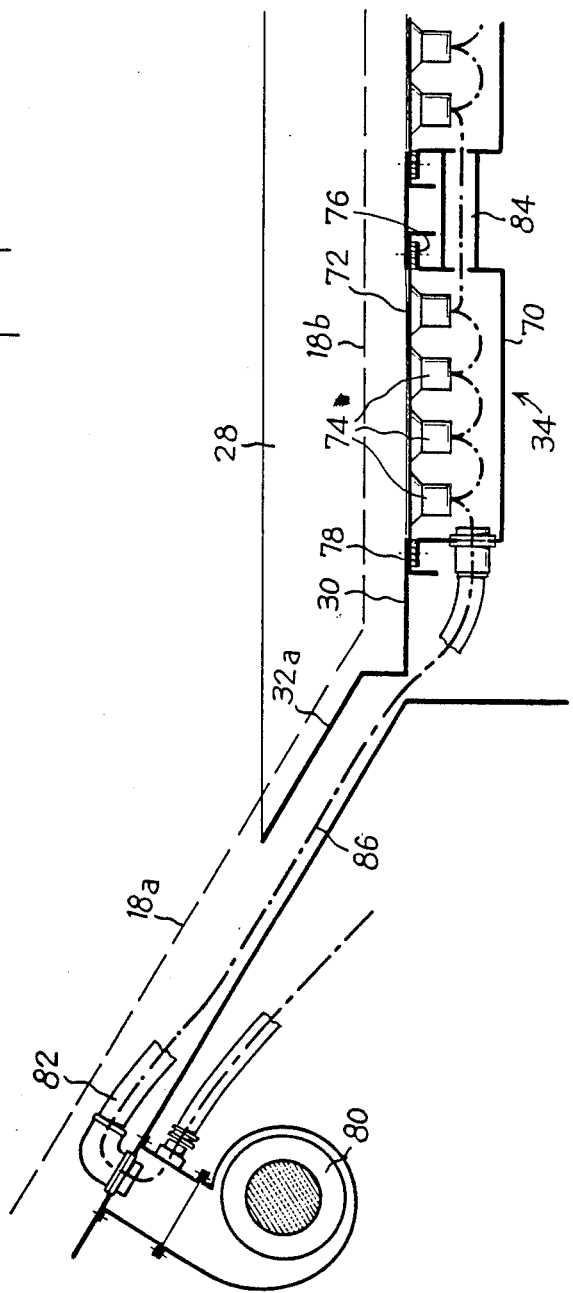

CLEANING APPARATUS FOR ELECTRONIC COMPONENTS AND/OR PRECISION PARTS OF MACHINERY

BACKGROUND OF THE INVENTION

The present invention relates to a cleaning apparatus used in particular for cleaning electronic components.

This type of apparatus is used in the electronics industry, particularly downstream of a wave soldering apparatus where electronic components are soldered on printed circuit boards.

In order to obtain a good soldered joint, in a soldering apparatus, the boards are first coated with flux, then they undergo a pre-heating stage where the volatile components of the flux evaporate and where the boards are pre-heated, the boards then pass along a standing wave of liquid solder, which they lick with their lower face whereafter the said boards exit from the soldering apparatus.

At that time, the boards carry many traces of more or less decomposed flux residues which have to be removed by the cleaning apparatus.

In typical manner, cleaning is achieved by spraying a solvent both over and under the boards carried by a conveyor going through the enclosure of the cleaning apparatus.

There are of course several spraying stages in the successive cleaning operations, typically four in number: pre-washing, washing, rinsing and final rinsing.

The solvent used in the final rinse-spraying stage is drawn by a final rinsing pump from a reservoir of purified solvent. After spraying, the solvent drains off into a second reservoir wherefrom it is drawn by a rinsing pump and sent back into the rinse-spraying ramps. The solvent used in the rinsing stage drains off into the second reservoir. Part of said solvent is routed via an overflow into a third reservoir shared by the washing stage and by the prewashing stage. It is drawn from that third reservoir by a pump which delivers it into the wash and prewash spraying ramps. After spraying, the solvent, by then containing more and more impurities, is routed towards the third reservoir.

Part of the solvent flows through an overflow from said third reservoir towards a draining reservoir. And because of the high cost of the solvents used, these are purified by an annexed distillation installation which draws the solvent filled with impurities from the draining reservoir and returns it once purified to the reservoir of the final rinse stage.

In order to prevent any considerable increase of impurities concentration in the successive stages, it is important to operate with large quantities of solvent which are constantly recycled and of which only a small part is progressively conveyed to the draining reservoir.

It is also known to have ultrasonic cleaning installations, but which generally use static solvent baths in which a batch of printed circuit boards is immersed for a preset period of time, this being done successively in several baths. This type of installation is not really suitable for automation and in particular for the continuous conveying of printed circuit cards from the inlet to the outlet of the cleaning apparatus.

There are also installations where the cleaning is performed exclusively with ultrasounds, and if, for various reasons, certain series of boards have to be spray-cleaned, then it is necessary to have another installation to this end, hence incurring a duplication of installations, an increased space requirement, and increased costs, maintenance, etc.

SUMMARY OF THE INVENTION

In order to overcome these disadvantages, the present invention proposes a cleaning apparatus for printed circuit boards, of the type comprising an enclosure through which passes a conveyor conveying the boards along a continuous path, at least one cleaning unit, using solvent and so arranged as to spray the solvent over and under the boards carried along said path, said apparatus further comprising a cleaning unit using ultra-sounds, which unit is constituted by a solvent storing tank arranged in said enclosure and equipped with ultrasonic generators, the said path having a portion which goes through the said storing tank so that the boards are immersed in the solvent along said path portion, and control means being provided for the selective control of said spray and ultrasonic cleaning units.

BRIEF DESCRIPTION OF THE DRAWING

The invention will be more readily understood on reading the following description with reference to the accompanying drawings, in which:

FIG. 1 is a diagrammatic longitudinal section of an apparatus according to the invention during a spray-cleaning operation, FIG. 2 is a similar view to that shown in FIG. 1, showing the apparatus during an ultrasonic cleaning operation, and FIG. 3 is a detailed view of the embodiment of the ultrasonic generators of the apparatus shown in FIGS. 1 and 2.

DETAILED DESCRIPTION OF THE PREFERRED EMBODIMENT

The apparatus, designated as a whole by the reference 10 in FIGS. 1 and 2, comprises an enclosure 12, which is substantially closed up and comprises an inlet aperture 14 and an outlet aperture 16. A conveyor, not shown in the figures for reasons of clarity, traverses the enclosure 12 from the inlet aperture to the outlet aperture, in order to define a path 18, illustrated in dash-and-dot lines, and along which move printed circuit boards exiting from a soldering machine, as indicated hereinabove in the introductory part, the boards arriving through the lefthand end of the cleaning apparatus, when looking at the figures.

Apparatus 10 comprises solvent-spraying cleaning units, numbering four in the illustrated example, namely a prewashing unit 20, a washing unit 22, a rinsing unit 24 and a final rinsing unit 26.

Path 18 has a first portion 18a which is inclined downwardly from inlet aperture 14 and prewashing unit 20 is formed of two spraying ramps 20i and 20s situated respectively above and under the downwardly inclined path portion 18a, thus ensuring the spraying of the solvent both over and under the boards conveyed along path 18.

Said path 18 continues with a horizontal portion 18b, and the two washing and rinsing units, respectively 22 and 24, are installed one behind the other along the horizontal path portion 18b, each unit being composed of spraying ramps (22i, 22s, 24i, 24s) situated above and under the path followed by the boards.

Finally, path 18 ends into an upwardly inclined portion 18c rising towards outlet aperture 16, and the final rinsing unit 26 is likewise composed of two spraying ramps 26i and 26s above and under the upwardly inclined path portion 18c.

At a short distance below the horizontal path portion 18b is situated a low depth tank 28 which, depending on the operating conditions, to be subsequently described, is provided for storing a certain quantity of solvent. The tank 28 has a bottom 30 which is substantially horizontal and parallel to path portion 18b, and sides 32, 32b, so that the boards moving on that path portion can be completely immersed in the shallow solvent sheet contained in tank 28.

A number of ultrasonic generators 34a, 34b, etc. . . . are disposed under the bottom 30 of tank 28, the structure of which generators will be subsequently described. Said tank and generators constitute an ultrasonic cleaning unit 29.

Preferably bottom 30 of tank 28 has the profile of two opposite gradients descending from a central zone 30c situated between the washing and rinsing units, respectively 22 and 24, towards two end zones 30a and 30b where said bottom is provided with draining pipes 36 and 38 equipped with valves 40 and 42.

A plurality of solvent reservoirs, separated by vertical partition walls are provided between the bottom 30 of tank 28 and the base 44 of enclosure 12.

These are, as illustrated from left to right in FIGS. 1 and 2: a washing reservoir 46, a draining reservoir 48 and a rinsing reservoir 50. A pure solvent reservoir 52 is provided at the right end of the apparatus, on a higher level than the other reservoirs.

Discharges through overflows are provided between the different reservoirs as follows:
   an overflow 54 from the pure solvent reservoir into the rinsing reservoir,
   an overflow 56 from the rinsing reservoir into the washing reservoir,
   an overflow 58 from the washing reservoir into the draining reservoir.

As will become obvious hereinafter, the draining reservoir 48 collects the solvent with the higher impurities content, and a draining pump 60 draws the solvent from said reservoir to deliver it into a still, known per se, and not shown in the drawings. The pure solvent returns from the still towards the pure solvent reservoir 52.

The other structural details of the apparatus according to the invention will be pointed out in the description of two operating modes of the apparatus, with reference to FIGS. 1 and 2, successively.

The spray-cleaning operation illustrated in FIG. 1 uses the set of four spray-cleaning units.

A final rinse pump 62 draws pure solvent from reservoir 52 to discharge it into the ramps of the final rinsing unit 26. The draining off solvent is collected in tank 28, having run down side 32e. According to this operating mode, the valve 42 is opened and the solvent then flows through pipe 38 towards rinsing reservoir 50. Said solvent is drawn from that reservoir by a rinsing pump 64 which discharges it into the ramps of rinsing unit 24.

The draining solvent is collected in tank 28 and flows along the inclined bottom 30 as far as pipe 38 and then into reservoir 50. The capacity of reservoir 50 is so calculated that the impurities concentration, taking into account the flow of pure solvent returning from the still, remains within a low range.

Overflow 56 thus conveys towards the washing reservoir 46, a flow of solvent which is substantially equal to the flow of pure solvent, and which contains a low concentration of impurities.

A washing pump 66 draws the solvent from the reservoir 46 to deliver it into the ramps of the prewashing and washing units, respectively 20 and 22. The solvent dripping from the ramps of the washing unit 22 falls into tank 28, flowing along the tank bottom 30 as far as pipe 36. The valve 40 is also opened and the solvent is collected into reservoir 46.

Ramps 20i, 20 s of the prewashing unit 20 are disposed at a certain distance from the side 32a so that the dripping solvent runs directly along the wall of the enclosure 12 toward reservoir 46 without passing through tank 28.

It is understood that, in the description given hereinabove, the ultrasonic generator remain inoperative.

The ultrasonic cleaning operation illustrated in FIG. 2, uses the ultrasonic cleaning unit as well as two of the spraying units, prewashing unit 20 and final rinsing unit 26.

In this case, valves 40 and 42 are closed, so that tank 28 fills up with the solvent and the printed circuit boards are immersed in the shallow solvent sheet all along portion 18b of path 18.

Washing unit 22 and rinsing unit 24 are inoperative. This is determined by stopping the rinsing pump 64 and by isolating the washing unit with a stop valve 68.

The pure solvent drawn from reservoir 52 and sprayed by spraying ramps 26i and 26s of the final rinsing unit is drained towards the tank by running down side 32b. Permanent drainage of the solvent is provided at the opposite end of the tank due to the fact that side 32a is less high than side 32b. Thus, the solvent sheet flows along the tank from the final rinse zone towards the prewash zone, hence in the direction opposite that followed by the boards along path 18, progressively picking up the impurities detached by the effect of the ultra-sounds produced by generators 34a, 34b.

In this mode of operation, the same transfers through overflows take place between the different reservoirs as described hereinabove.

It will be noted that the short distance between bottom 30 of tank 28 and path portion 18b permits, on the one hand, an excellent action from the ultrasonic generators 34, and on the other hand, a limitation of the volume of solvent contained in the tank. It is thus possible, with the quantity of pure solvent admitted through the final rinsing ramps 26i, 26s and through side 32b, to set up an efficient circulation and to renew the solvent inside the tank, thus limiting the maximum impurities concentration at the other end of the tank to an acceptable value.

Understandably, the apparatus also comprises control means, not shown, with all the circuits necessary for the selective control of the different units, in order to switch from one mode of operation to the other.

Said control means also control the switching on and off of the pumps of the apparatus as well as the opening and closing of the valves in the way indicated throughout the description.

Thus, the invention renders possible, with the same machine, to perform a continuous cleaning of printed circuit boards either by spraying, or by ultra-sounds, or by a combination of both.

Because of the presence inside the enclosure, of an atmosphere constantly saturated with solvent vapors, which could damage the transducers of the ultrasonic generators, it is recommended to design said generators as illustrated in FIG. 3.

Each generator 34 comprises a substantially parallelepipedal casing 70 provided with a flat lid 72 on which are bonded the transducers 74, the lid being fixed on a flanged edge 76 of the casing with interposition of a seal 78. The casings are thereafter fastened underneath the bottom 30 of tank 28, which bottom is provided with corresponding openings so that the solvent is in direct contact with the outer face of the lid 72.

The casings are permanently kept under gaseous pressure, with dry air, or a neutral gas, or a mixture of neutral gases, by blowing means 80. The delivery pipe 82 of said blowing means traverses, in tight manner, the enclosure 12 and the wall of casing 70. The casings of the other generators are interconnected in succession by transfer pipes 84.

In this way, the transducers are sheltered from the saturated vapors of solvent without need to take particular care of the tightness of the casings. And the long term difficulties resulting from any loss of tightness of the casing, despite all the cares taken when producing the casing, are also avoided.

Also according to the invention, there is no absolute need to provide a perfect insulation on the path of the electric cable 86 supplying the transducers, since this cable is placed in the gas-pressurizing pipe 82, and then traverses from one casing to the next through pipes 84.

Considering that the delivery rate of the blower means is virtually nil, said means can have very small dimensions, and will only require a low power supply.

The apparatus can of course be used for cleaning other elements than the printed circuit boards mentioned hereinabove, such as for example precision parts of machinery, whether or not these are associated to electronic assemblies.

Finally, among suitable solvents, there is water. Purification of that water can be performed by any of the conventional purification or regeneration installations, instead of the still referred to in the illustrated examples.

What is claimed is:

1. Dual mode cleaning apparatus for selectively cleaning articles by a first spray cleaning mode, a second ultrasonic cleaning mode, or a combination of said first and second modes comprising, an enclosure having an inlet and an outlet, a conveyor extending through said enclosure from said inlet to said outlet for carrying said articles therethrough, a shallow solvent storing tank within said enclosure beneath said conveyor, said conveyor inclining downwardly from said inlet toward said solvent storing tank, extending generally horizontally across said tank, and including upwardly from said tank to said outlet, said tank having a bottom and opposite end walls, said end walls including portions inclining upwardly beneath said conveyor toward said inlet and said outlet, the top of said end wall at said inlet being lower than the top of said end wall at said outlet whereby solvent flows toward and over said inlet end wall counter to the displacement direction of said conveyor when said tank contains a bath of solvent in said second cleaning mode, means for cleaning said articles in said first mode including spray means positioned to spray solvent against said articles from above and below said conveyor, a solvent reservoir within said enclosure beneath said tank for receiving solvent dripping from said articles after being emitted from said spray means and solvent flowing over said inlet end wall, drain means in said tank for selectively draining solvent from said tank into said reservoir, and ultrasonic generator means disposed beneath said tank bottom for ultrasonically cleaning said articles moving through said bath of solvent within said tank in said second mode, said spray means including a final rinsing unit positioned over said upwardly inclining portion of said conveyor whereby solvent with the lowest impurities content drains onto the associated incline portion of the end wall and into the corresponding end of said tanks.

2. Dual mode cleaning apparatus as defined in claim 1 wherein said spray means includes a first prewashing unit positioned over the downwardly inclining portion of said conveyor whereby solvent sprayed therefrom onto said articles drains directly into said reservoir.

3. Dual mode cleaning apparatus as defined in claim 2, wherein said spray means includes a second washing unit positioned over said solvent storing tank at the inlet side thereof and a third rinsing unit positioned over said solvent storing tank at the outlet side thereof, whereby solvent sprayed from said second and third unit onto said articles drains into said solvent storing tank.

4. Dual mode cleaning apparatus as defined in claim 3, wherein said bottom of said tank slopes downwardly toward each said end wall from a point intermediate said second washing unit and said third rinsing unit, said drain means including first and second outlets in said bottom adjacent the inlet and outlet end walls, respectively, for draining solvent from each end of said tank into said reservoir, and means dividing said reservoir into a separate section for receiving the solvent from each said outlet.

5. Dual mode cleaning apparatus as defined in claim 4, including valve means in each said outlet for selectively opening and closing said outlets.

6. Dual mode cleaning apparatus as defined in claim 4, including partition walls extending across said reservoir dividing said reservoir sequentially into washing, draining and rinsing reservoir sections, said first outlet draining into said washing reservoir section and said second outlet draining into said rinsing reservoir section, said rinsing reservoir section being adapted so that said solvent overflows therefrom into said washing reservoir section and said washing reservoir section being adapted so that said solvent overflows therefrom into said draining reservoir section.

7. Dual mode cleaning apparatus as defined in claim 6, including a pure solvent reservoir adjacent said washing reservoir section adapted so that solvent overflows therefrom into said washing reservoir section.

* * * * *